US011474343B2

(12) United States Patent
Raz et al.

(10) Patent No.: US 11,474,343 B2
(45) Date of Patent: Oct. 18, 2022

(54) TUNABLE MEMS ETALON DEVICE

(71) Applicant: UNISPECTRAL LTD., Ramat Gan (IL)

(72) Inventors: Ariel Raz, Kfar Vradim (IL); Viacheslav Krylov, Holon (IL); Eliahu Chaim Ashkenazi, Jerusalem (IL); Peleg Levin, Rishon le-Zion (IL)

(73) Assignee: UNISPECTRAL LTD., Ramat Gan (IL)

(*) Notice: Subject to any disclaimer, the term of this patent is extended or adjusted under 35 U.S.C. 154(b) by 230 days.

(21) Appl. No.: 16/461,808

(22) PCT Filed: Nov. 20, 2017

(86) PCT No.: PCT/IB2017/057261
§ 371 (c)(1),
(2) Date: May 17, 2019

(87) PCT Pub. No.: WO2018/092104
PCT Pub. Date: May 24, 2018

(65) Prior Publication Data
US 2019/0361220 A1 Nov. 28, 2019

Related U.S. Application Data

(60) Provisional application No. 62/424,472, filed on Nov. 20, 2016.

(51) Int. Cl.
G02B 26/00 (2006.01)
B81B 3/00 (2006.01)
G02B 5/28 (2006.01)

(52) U.S. Cl.
CPC .......... G02B 26/007 (2013.01); B81B 3/0056 (2013.01); G02B 5/284 (2013.01); B81B 2201/042 (2013.01)

(58) Field of Classification Search
CPC .... G02B 26/007; G02B 5/284; G02B 26/001; B81B 3/0056; B81B 2201/042; G01J 3/2823; G01J 3/51; G01J 3/32; G01J 3/26
See application file for complete search history.

(56) References Cited

U.S. PATENT DOCUMENTS 6,424,466 B1    7/2002   Flanders
6,594,059 B2    7/2003   Flanders
(Continued)

FOREIGN PATENT DOCUMENTS

CN    101718910 A    6/2010
CN    102053361 A    5/2011
(Continued)

OTHER PUBLICATIONS

A. Ya'akobovitz, S. Krylov, Influence of Perforation on Electrostatic and Damping Forces in Thick SOI MEMS Structures, J. Micromech. Microeng. 22, pap. 115006, 2012.
(Continued)

Primary Examiner — Kimberly N. Kakalec
(74) Attorney, Agent, or Firm — Kenealy Vaidya LLP

(57) ABSTRACT

Tunable MEMS etalon devices comprising: a front mirror and a back mirror, the front and back mirrors separated in an initial pre-stressed un-actuated etalon state by a gap having a pre-stressed un-actuated gap size determined by a back stopper structure in physical contact with the front mirror and back mirrors, the etalon configured to assume at least one actuated state in which the gap has an actuated gap size gap greater than the pre-stressed un-actuated gap size; an anchor structure, a frame structure fixedly coupled to the front mirror at a first surface thereof that faces incoming light, and a flexure structure attached to the anchor structure and to the frame structure but not attached to the front mirror, and a spacer structure separating the anchor structure
(Continued)

from the back mirror, and wherein the front mirror and the spacer structure are formed in a same single glass layer.

20 Claims, 11 Drawing Sheets

(56) References Cited

U.S. PATENT DOCUMENTS

| | | | |
|---|---|---|---|
| 6,961,182 B2 | 11/2005 | Murata | |
| 7,177,505 B2 | 2/2007 | Willcox | |
| 7,420,738 B2 | 9/2008 | Verghese | |
| 7,564,612 B2 | 7/2009 | Chui | |
| 7,733,553 B2 | 6/2010 | Faase et al. | |
| 7,760,197 B2 | 7/2010 | Faase et al. | |
| 7,936,056 B2 | 5/2011 | Hatakeyama | |
| 8,164,757 B2 | 4/2012 | Yamanoi et al. | |
| 8,378,434 B2 | 2/2013 | Krylov et al. | |
| 8,384,905 B2 | 2/2013 | Wu | |
| 8,848,197 B2 | 9/2014 | Pruessner et al. | |
| 10,854,662 B2* | 12/2020 | Raz | G02B 5/284 |
| 2003/0011864 A1 | 1/2003 | Flanders | |
| 2007/0211257 A1* | 9/2007 | Kearl | G02B 26/001 356/519 |
| 2008/0013145 A1 | 1/2008 | Chui et al. | |
| 2009/0279162 A1 | 11/2009 | Chui | |
| 2012/0188646 A1 | 7/2012 | Sano et al. | |
| 2014/0069232 A1 | 3/2014 | Elata et al. | |
| 2014/0165724 A1 | 6/2014 | Krylov et al. | |
| 2014/0204461 A1* | 7/2014 | Imai | G02B 7/008 359/513 |
| 2015/0103343 A1* | 4/2015 | Smith | G01J 3/0205 356/326 |
| 2015/0153563 A1 | 6/2015 | Kamal et al. | |
| 2015/0298322 A1 | 10/2015 | Morris et al. | |
| 2016/0171653 A1 | 6/2016 | Mendlovic et al. | |
| 2018/0129035 A1 | 5/2018 | Sano et al. | |
| 2018/0205915 A1 | 7/2018 | Krylov et al. | |

FOREIGN PATENT DOCUMENTS

| | | |
|---|---|---|
| CN | 102608689 A | 7/2012 |
| CN | 102902039 A | 1/2013 |
| CN | 102902060 A | 1/2013 |
| CN | 103048781 A | 4/2013 |
| CN | 203069504 U | 7/2013 |
| CN | 105242395 A | 1/2016 |
| CN | 105425384 A | 3/2016 |
| CN | 107850771 A | 3/2018 |
| JP | 2005-17468 A | 1/2005 |
| JP | 2005024825 A | 1/2005 |
| JP | 2010008644 A | 1/2010 |
| JP | 2013-7828 A | 1/2013 |
| JP | 2013224995 A | 10/2013 |
| JP | 2015-31904 A | 2/2015 |
| WO | 2014207742 A2 | 12/2014 |
| WO | 2017009850 A1 | 1/2017 |

OTHER PUBLICATIONS

C. G. Agudelo, M. Packirisamy, G. Zhu, L. Saydy, "Nonlinear control of an electrostatic micromirror beyond pull-in with experimental validation," J. MEMS 18, 914-923 (2009).

J. Wei "Wafer Bonding Techniques for Microsystem Packaging," Journal of Physics: Conference Series 34 (2006) 943-948.

S. Krylov and Y. Bernstein, "Large Displacement Parallel Plate Electrostatic Actuator with Saturation Type Characteristic," Sensors and Actuators A—Physical, 130-131, 497-512, 2006.

S. Rabanim, E. Amir, S. Krylov, "Bistable Threshold Sensor With Mechanically Nonlinear Self-Limiting Suspension and Electrostatic Actuation," Proc. of the ASME 2011 International Design Engineering Technical Conferences & Computers and Information in Engineering Conference IDETC/CIE 2011 Aug. 28-31, 2011, Washington, DC, USA.

A. Ya'akobovitz, S. Krylov, and Y. Hanein, "A MEMS Nano-extensometer with Integrated De-amplification Mechanism," Microsystem Technologies, 17(3) pp. 337-345, 2011.

N. M. Elman, S. Krylov, M. Sternheim , Y. Shacham-Diamand, "Multiple Aspect-Ratio Structural Integration in Single Crystal Silicon (MASIS) for fabrication of Transmissive MOEMS Modulators," Microsystem Technologies, 14 (2), 287-293, 2008.

T. Shmilovich and S. Krylov, "Single Layer Tilting Actuator with Multiple Close-Gap Electrodes," Journal of Micromechanics and Microengineering, 19(8), paper 085001, 2009.

Y. Gerson, S. Krylov and B. Ilic, "Electrothermal Bistability Tuning in a Large Displacement Micro Actuator," Journal of Micromechanics and Microengineering, 20, paper 112001, 2010.

A. Engel and R. Friedrichs, "On the electromagnetic force on a polarizable body," Am. J. Phys. 70, 428-432, 2002.

H. Ræder, F. Tyholdt, W. Booij, F. Calame, N. P. Østbø, R. Bredesen, K. Prume, G. Rijnders, P. Muralt, Taking piezoelectric microsystems from the laboratory to production, J. Electroceram., 19, 2007, 357-362.

S. Schmid, C. Hierold, and A. Boisen, "Modeling the Kelvin polarization force actuation of micro- and nanomechanical systems," Journal of Applied Physics 107, 054510, 2010.

Baglio, S., et al. "Optical SOI micro-gravimeters with bulk PZT excitation." Sensors, 2004 IEEE. IEEE, 2004. (cited under A, can submit abstract).

Zavracky, Paul M., et al. "Micromachined scanning Fabry-Perot interferometer." Micromachined Devices and Components IV. vol. 3514. International Society for Optics and Photonics, 1998.

* cited by examiner

Cap

Bottom

Eutectic bonding

TUNABLE MEMS ETALON DEVICE

CROSS REFERENCE TO RELATED APPLICATIONS

This application claims the benefit of U.S. Provisional patent application 62/424,472 filed Nov. 20, 2016 and having the same title, which is incorporated herein by reference in its entirety.

TECHNOLOGICAL FIELD

The presently disclosed subject matter relates generally to Micro-Electro-Mechanical systems (MEMS) and more particularly to tunable MEMS-based spectral filters.

BACKGROUND ART

References considered to be relevant as background to the presently disclosed subject matter are listed below:

[1] A. Ya'akobovitz, S. Krylov, "Influence of Perforation on Electrostatic and Damping Forces in Thick SOI MEMS Structures," *J. Micromech. Microeng.* 22, pap. 115006, 2012.

[2] C. G. Agudelo, M. Packirisamy, G. Zhu, L. Saydy, "Nonlinear control of an electrostatic micromirror beyond pull-in with experimental validation," *J. MEMS* 18, 914-923, 2009.

[3] J. Wei "Wafer Bonding Techniques for Microsystem Packaging," *Journal of Physics: Conference Series* 34 (2006) 943-948

Acknowledgement of the above references herein is not to be inferred as meaning that these are in any way relevant to the patentability of the presently disclosed subject matter.

BACKGROUND

Color imaging is known and performed in general using digital cameras having pixelated image sensors covered with color filter arrays (CFAs), for example Bayer-type CFAs. Recently, systems and methods for color imaging using sequential imaging have been proposed, see e.g. co-assigned international patent application publication WO 2014/207742. Such systems and methods allow capture of colorful images with improved color fidelity and/or with hyper spectral color information.

In general, sequential imaging utilizes a tunable spectral filter placed along a line of sight of the camera image sensor. The image sensor is operated to acquire a series of images in a short time sequence while the spectral transmission of the tunable spectral filter is varied. Accordingly each image of the series corresponds to a different color content of the captured scene, in accordance with the state/profile of spectral transmission of the filter set when the respective image was taken.

An example of a tunable spectral filter that can be used for sequential imaging as above is an etalon. An etalon comprises two parallel mirrors. The spectral transmission profile is determined by the gap between the mirrors. The tuning of a voltage applied to etalon tunes the gap between the mirrors (which provides a so called "optical cavity") and, in turn, tunes the spectral transmission profile. The two mirrors may be for example a semi-transparent front mirror and a semi-transparent back mirror. In some examples, the back mirror may be, for example, stationary while the front mirror may be movable toward/away from the back mirror in order to change the distance (optical cavity) between them, and thereby tune the spectral transmission profile.

Etalons are widely used in optical communication to filter, modulate and/or control the properties of optical signals, such as laser light beams, transmitted along the optical communication channels. Yet when considering optical communication, often the filter is required to operate accurately and efficiently in only a limited spectral band (e.g. of several nanometers), and is not required to provide specific/ wide transmission profiles as in many cases required for sequential spectral imaging applications (see e.g. WO 2014/207742).

SUMMARY

In some imaging applications, for example, regular (e.g. RGB) color image data acquisition, IR image data acquisition and/or high spectral imaging, not only is the etalon often required to have a wide spectral transmission profile and wide free spectral range (which may impose a short distance between the etalon mirrors), but also it may be required to be laterally wide enough so as to cover the entire field of view of the image sensor in front of which it is positioned.

As a consequence, tunable etalons for use in sequential spectral color imaging have often very high aspect ratio between their width and the distance between their mirrors.

While the general principles of etalon operation are well known, several limiting factors of conventional etalon configurations deters their use for sequential spectral imaging applications. One such limiting factor relates to the tuning range and resolution of the gap between the etalon mirrors, which is limited in the conventional tunable etalon configurations. As described in detail below, this issue is solved in certain examples disclosed herein by providing novel etalon configurations. Another limiting factor of the conventional etalon configurations is that high end actuators used in such etalons (actuation mechanism and/or feedback mechanism) are costly and not suitable for mass production. In contrast, MEMS-based etalons disclosed herein may be mass-produced with relatively low costs.

One challenge is the manufacturing variations that will be expressed in distorted transmission spectrum. Thus, designs of the tunable etalon MEMS devices disclosed herein were developed based on an opto-mechanical model which estimates reasonable manufacturing tolerances, quantifies the spectral distortion and calibrates the acquired signal accordingly.

In some examples disclosed herein, in which electrostatic actuation is used, the displacement/gap and parallelism between the front mirror and the back mirror may be adjusted by applying electric potential difference between two or more regions of electrodes formed on an actuation layer (including for example, the actuation substrate carrying the actuation mechanism, being part of the functional mechanical layer) which are substantially electrically insulated from one another, and an approximately parallel set of electrodes formed on a functional mechanical layer to thereby cause electrostatic forces between them. The functional layer is considered here as the layer which experiences a displacement upon applying the actuation force.

In examples where the electrodes are formed in the handle layer of a silicon-on-insulator (SOI) wafer, they may be electrically insulated from one another by trenches in the layer.

Embodiments disclosed herein teach several tunable MEMS etalon architectures and actuation paradigms. A common feature in all the embodiments is that the front mirror (of the two mirrors the one facing incoming light) is attached to a MEMS functional mechanical layer. The use of MEMS actuators allows low-cost mass fabrication of the proposed etalons and renders them suitable for implementation in consumer electronics devices. According to some examples, attachment of the front mirror to the functional mechanical layer is done by pick and place technique as known in the art.

In addition to the above features, the method according to this aspect of the presently disclosed subject matter can optionally comprise one or more of features (i) to (xix) listed below, in any technically possible combination or permutation:

According to one example of the presently disclosed subject matter there is provided a tunable etalon device comprising a front mirror and a back mirror, the front and back mirrors separated in an initial un-actuated etalon state by a gap having a pre-stressed un-actuated gap size, the etalon configured to assume at least one actuated state in which the gap has an actuated gap size greater than the pre-stressed un-actuated gap size.

In addition to the above features, in some examples the presently disclosed subject matter can further comprise one or more of features (i) to (xxxiv) listed below, in any technically possible combination or permutation:

i). Wherein the pre-stressed un-actuated gap size is determined by a back stopper structure in physical contact with the front and back mirrors.

ii). Wherein the back stopper structure may be formed initially on either mirror.

iii). The tunable etalon devices disclosed herein are fabricated using MEMS technologies and are therefore also referred to as tunable MEMS etalon devices.

iv). The tunable etalon device disclosed herein, further comprises an anchor structure, a frame structure fixedly coupled to the front mirror, and a flexure structure attached to the anchor structure and to the frame structure but not attached to the front mirror.

v). The tunable etalon device disclosed herein, further comprises a spacer structure separating the anchor structure from the back mirror, and wherein the front mirror and the spacer structure are formed in a same single layer.

vi). Wherein, the back mirror is included in a layer made of a transparent or semi-transparent material. In some examples, the transparent or semi-transparent material can be anyone of the following materials: glass; plastic; silicon; and germanium.

vii). Wherein, the transparent or semi-transparent layer further includes a recess for assisting in pre-stressing the flexure structure to enhance the pre-stressed un-actuated state.

viii). Wherein, the anchor structure, the frame structure and the flexure structure are made of silicon (Si).

ix). The tunable etalon device, wherein the anchor structure, the frame structure and the flexure structure are formed in a same single layer.

x). The tunable etalon device, wherein the single layer is made of anyone of the following materials: glass; plastic; silicon; and germanium.

xi). The tunable etalon device, wherein the back mirror is integrated in a layer made of a transparent or semi-transparent material (including for example: anyone of the following materials: glass; plastic; silicon; and germanium.

xii). The tunable etalon device, wherein the back mirror is included in a hybrid structure comprising a combination of at least two materials wherein a first material of the at least two materials is transparent or semi-transparent, and a second material of the at least two materials is stiffer than the first material.

xiii). The tunable etalon device, wherein the different materials include for example glass and silicon.

xiv). The tunable etalon device further comprising a cap plate located at object side relative to the front mirror.

xv). The tunable etalon device further comprising a front stopper structure that determines a minimal gap between the front mirror and a cap plate.

xvi). The tunable etalon device, wherein the cap plate accommodates at least part of an actuation mechanism configured for controlling a gap size between the front mirror and the back mirror.

xvii). The tunable etalon device, wherein the cap plate includes at least one first electrode formed on a cap surface facing the frame structure, wherein the frame structure is configured to act as a second electrode, and wherein the frame structure is movable by electrostatic actuation using the first and second electrodes.

xviii). The tunable etalon device, wherein the at least one first electrode includes a plurality of electrodes insulated electrically from each other.

xix). The tunable etalon device further comprising a front stopper structure that determines a minimal electrostatic gap between the frame structure and the at least one first electrode.

xx). The tunable etalon device, wherein the cap plate includes a transparent or semi-transparent material, thereby providing a tunable etalon enclosed between two transparent or semi-transparent plates.

xxi). The tunable etalon device further comprising a Si layer serving as the at least one first electrode, wherein the frame structure is configured to act as a second electrode, and wherein the frame structure is movable by electrostatic actuation using the first and second electrodes.

xxii). The tunable etalon device wherein the Si layer is a handle layer of a silicon-on-insulator (SOT) wafer, the device being an "SOT device".

xxiii). The tunable etalon device wherein the at least one first electrode includes a plurality of first electrodes formed in the handle layer of the SOT wafer, the first electrodes connected mechanically and insulated electrically from each other.

xxiv). The tunable etalon device further comprising a buried oxide (BOX) layer separating the Si layer from the frame structure, the BOX layer having a thickness that determines an electrostatic gap between the front mirror and the first electrode in the pre-stressed un-actuated device state.

xxv). The tunable etalon device further comprising an opening in the handle layer of the SOT wafer to allow light passage to the front and back mirrors.

xxvi). The tunable etalon device further comprising a first lens integrated with the back mirror and a second lens integrated with the cap.

xxvii). The tunable etalon device of any of claims 19-22 or 24-27, further comprising a respective lens integrated with each of the front and back mirrors.

xxviii). The tunable etalon device of any of claims 19-22 or 24-27, further comprising a respective lens integrated with the back mirror and the cap.

xxix). The tunable etalon device of any one of claims 2-22 or 24-27, wherein the gap in each of the first and the second states allows light in a certain wavelength range to pass through the etalon.

xxx). The tunable etalon device of claim 25, wherein the actuated gap size between the front mirror and the back mirror is defined by front stoppers that separate between a frame structure and a cap.

xxxi). Wherein the actuation mechanism includes a piezo-electric actuator.

xxxii). Wherein the actuation mechanism includes Kelvin force actuation electrodes.

xxxiii). The tunable etalon device of any one of claims is designed to assume one of a first state and a second state, wherein the gap in each of the first and the second state allows light in a certain wavelength range to pass through the etalon; wherein the first state is the initial pre-stressed un-actuated state having an un-actuated gap size between the front mirror and the back mirror, which is defined by the back stoppers; and the second state is an actuated state in which the gap size between the front mirror and the back mirror has an actuated gap size greater than the pre-stressed un-actuated gap size.

xxxiv). Wherein the actuated gap size between the front mirror and the back mirror is defined by front stoppers.

According to another aspect of the presently disclosed subject matter there is provided an imaging device comprising:

a) a tunable etalon device comprising a front mirror and a back mirror, the front and back mirrors separated in an initial pre-stressed un-actuated state by a gap having a pre-stressed un-actuated gap size, the etalon configured to assume at least one actuated state in which the gap has an actuated gap size gap greater than the pre-stressed un-actuated gap size;

b) an image sensor; and c) a controller configured and operable to tune the tunable etalon device and to capture image data through the image sensor.

The imaging device accordance with the presently disclosed subject matter can optionally comprise one or more of features (i) to (xxxiv) listed above, mutatis mutandis, in any desired combination or permutation.

BRIEF DESCRIPTION OF THE DRAWINGS

Non-limiting examples of embodiments disclosed herein are described below with reference to figures attached hereto that are listed following this paragraph. The drawings and descriptions are meant to illuminate and clarify embodiments disclosed herein, and should not be considered limiting in any way. Like elements in different drawings may be indicated by like numerals.

DETAILED DESCRIPTION

Figure 1A:
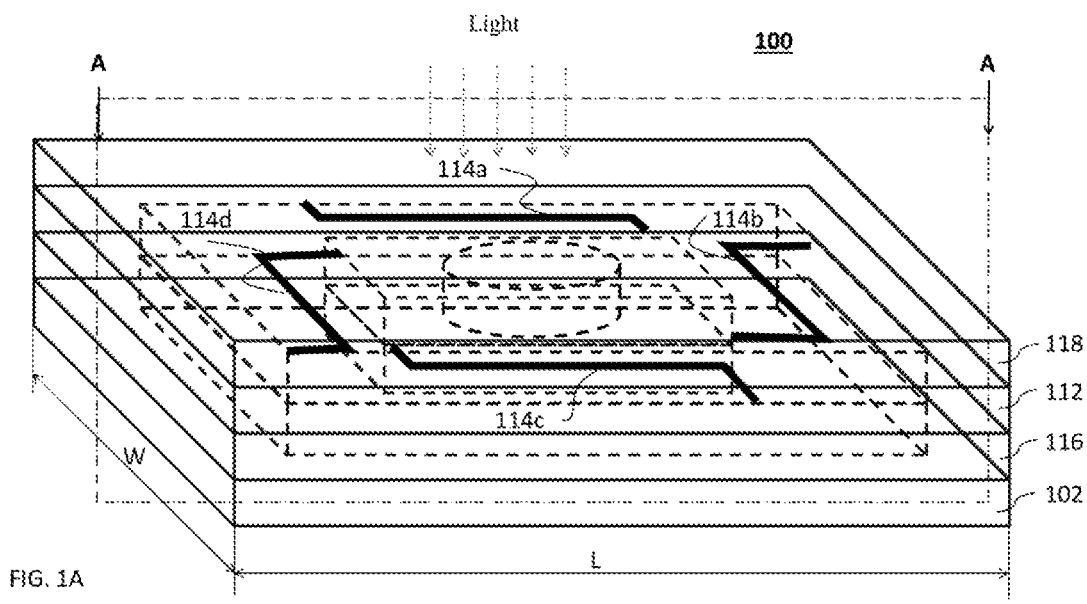
FIG. 1A shows schematically in an isometric view a tunable MEMS etalon device, according to an example of the presently disclosed subject matter.
Figure 1B:
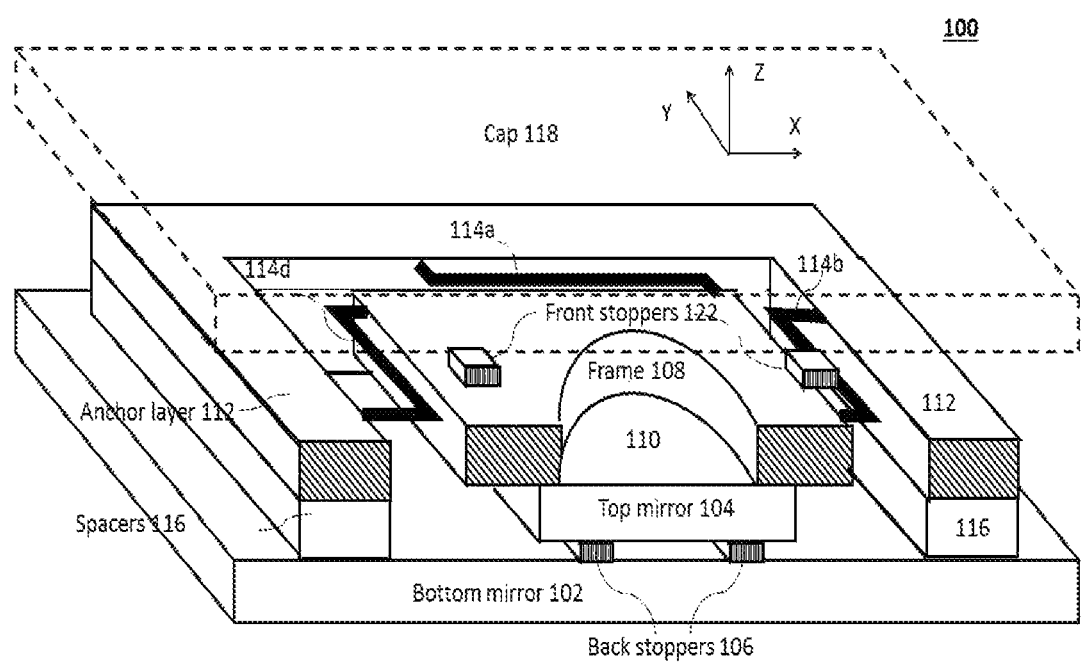
FIG. 1B shows schematically the device of FIG. 1A with a cross section, according to an example of the presently disclosed subject matter.
Figure 2A:
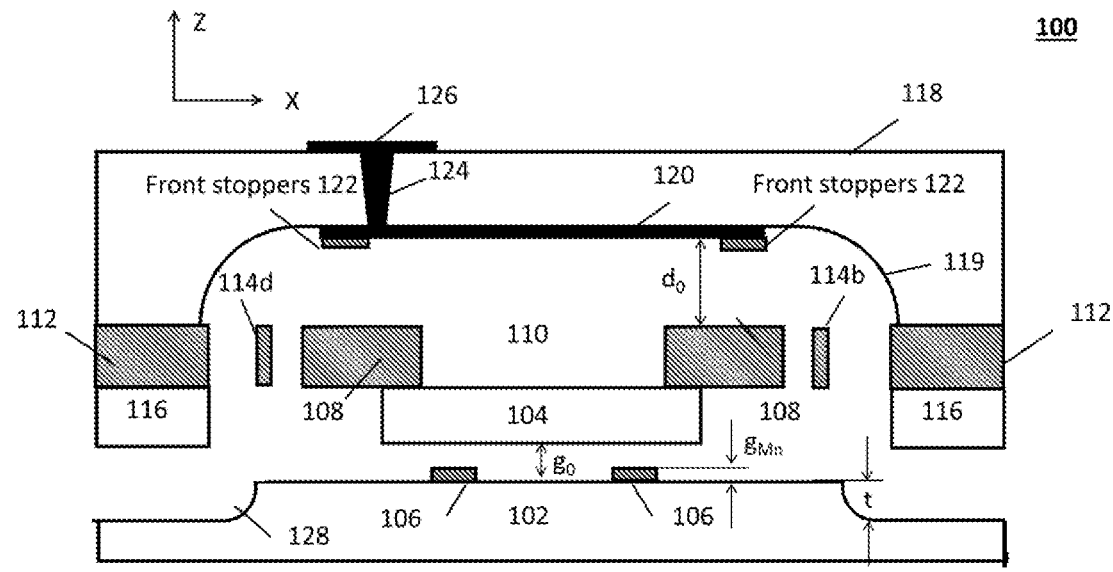
FIG. 2A shows the device of FIG. 1B in an initial as-fabricated, non-stressed un-actuated state, according to an example of the presently disclosed subject matter.
Figure 2B:
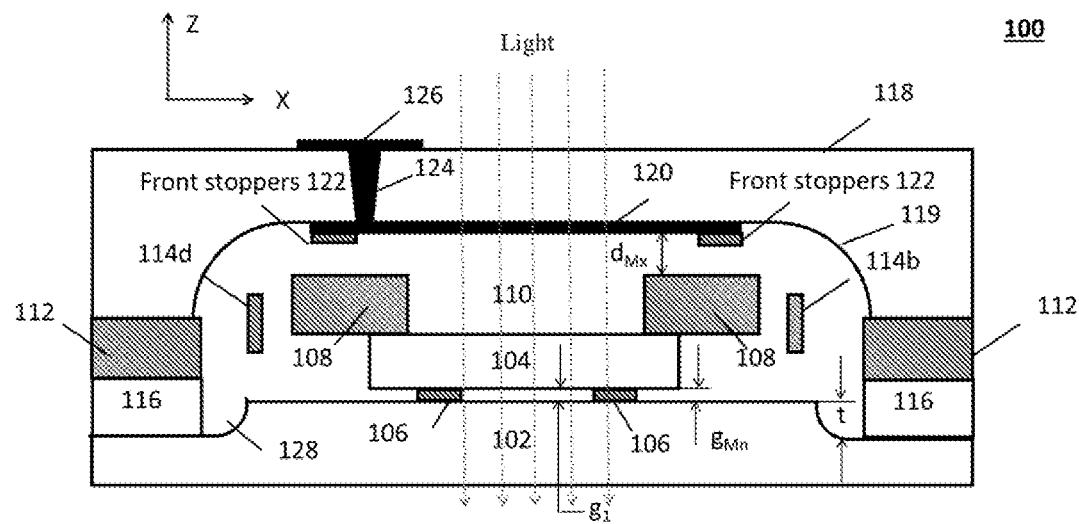
FIG. 2B shows the device of FIG. 2A in an initial pre-stressed un-actuated state, according to an example of the presently disclosed subject matter.
Figure 2C:
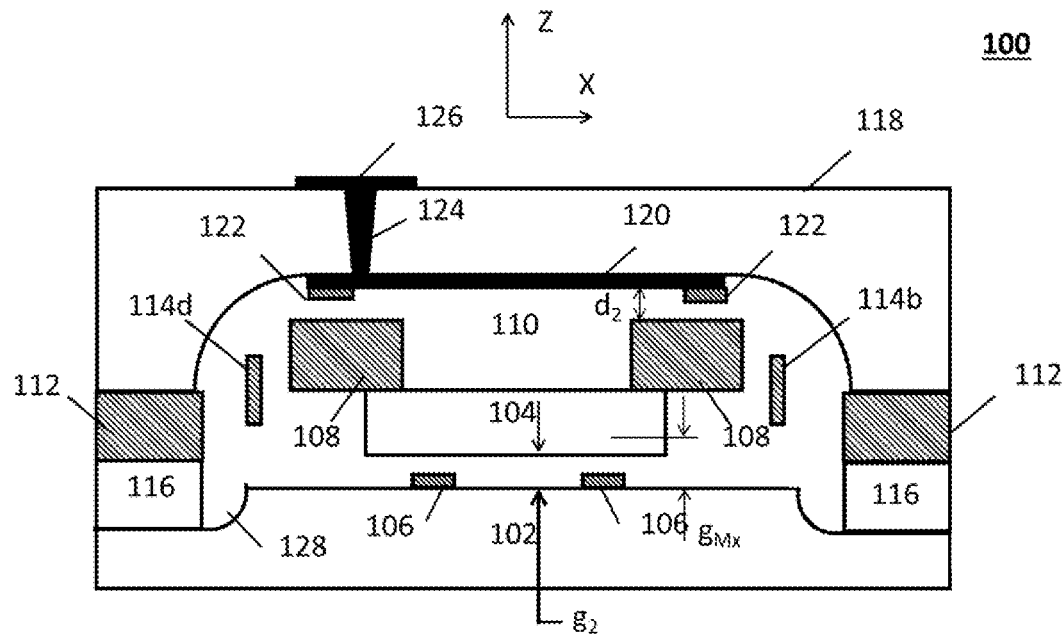
FIG. 2C shows the device of FIG. 2B in an actuated state, according to an example of the presently disclosed subject matter.

FIG. 1A shows schematically in an isometric view a first example of a tunable MEMS etalon device disclosed herein and numbered 100. FIG. 1B shows an isometric cross section of device 100 along a plane marked A-A. Device 100 is shown in conjunction with a XYZ coordinate system, which also holds for all following drawings. FIGS. 2A, 2B and 2C show cross sections of device 100 in plane A-A in three configurations (states): an as-fabricated (non-stressed) un-actuated state (FIG. 2A), a pre-stressed un-actuated state (FIG. 2B), and an actuated state (FIG. 2C). Device 100 comprises two substantially flat and parallel mirrors/reflective-surfaces, a bottom (or "back") mirror 102 and a top (or "aperture") mirror 104 separated by a "back" gap. As used herein, the terms "front" and "back" reflect the orientation of the device toward light rays.

As shown, the front (top) mirror is the first mirror in the path of light rays entering the etalon. In one example, the mirrors are formed in flat plates or wafers made of transparent or semi-transparent material to light in a desired wavelength range transmitted by the tunable etalon filter (e.g. glass). In the following discussing the term "glass" is used as a general non-limiting example. It is noted that the term glass should not be construed as limiting and other materials are also contemplated including any material or combination of materials with suitable transparency to light in a required wavelength range for the etalon and the image sensor to function in a desired way, for example plastic, silica, germanium, or silicon (silicon is transparent to wavelengths of roughly 1-8 μm). As used herein, the term "plate", "wafer" or "layer" refers to a substantially two-dimensional structure with a thickness defined by two parallel planes and having a width and a length substantially larger that the thickness. "Layer" may also refer to a much thinner structure (down to nanometers-thick, as opposed to a typical thickness of micrometers for the other layers).

In an embodiment, back mirror 102 is formed in a glass layer that also serves as a substrate of the device. In other embodiments, back mirror 102 may be formed in a "hybrid" plate or hybrid material such that a central section ("aperture") through which the light rays pass is transparent to the wavelength of the light (made e.g. of a glass), while plate sections surrounding the aperture are made of a different material, for example silicon. The hybrid aspect may increase the stiffness and strength of the mirror.

In the as-fabricated state, FIG. 2A, the back gap between the front and back mirrors has a size marked by $g_0$. In the un-actuated state, FIG. 2B, the back gap has a size marked by $g_1$. In an actuated state, FIG. 2C, the back gap has a size marked by $g_2$. The mirrors are movable with respect to each other so that back gap can be tuned between certain minimal ($g_{Mn}$) and maximal ($g_{Mx}$) gap sizes. The movement is in the Z direction in the particular coordinate system shown. Specifically, according to certain examples disclosed herein, back mirror 102 (facing sensor side relative to front mirror) is fixed and front mirror 104 (facing object side relative to back mirror) is movable. The gap size is minimal in the pre-stressed un-actuated state, so $g_1=g_{Mn}$. The maximal back gap size $g_{Mx}$ corresponds to a "maximal" actuated state. There are of course many actuated states (and even a continuous range of states) in which the back gap has a value $g_2$ between $g_{Mn}$ and $g_{Mx}$.

Device 100 further comprises a first stopper structure (also referred to as "back stoppers") 106 positioned between mirrors 102 and 104 in a way such as not to block light rays designed to reach an image sensor. Back stoppers 106 may be formed on either mirror. In the initial as-fabricated un-actuated state, FIG. 2A, the two mirrors are located in a close proximity to each other, the minimal gap distance $g_{Mn}$ being defined by back stoppers 106 which function as displacement limiters. An additional function of stoppers 106 is to prevent undesirable displacement of the front mirror due to external shock and vibration. Back stoppers 106 are designed to prevent contact between the mirrors and ensure that $g_{Mn}$ is never zero. They may be located within an optical aperture area if their size is small and they do not obscure significantly the optical signal. The location of the back stoppers within an optical aperture area may be optimized in such a way that the displacement of movable front mirror 104 is minimal. In some examples, back stoppers 106 are made of a metal such as patterned Cr—Au layer, Ti—Au layer or Ti—Pt layer. The degrees of reflectivity/transparency of the top and back mirrors are selected in accordance with the desired spectral transmission properties of the etalon. According to some examples, each mirror is at least semi-reflective to some degree.

Device 100 further comprises a mounting frame structure (or simply "frame") 108 with an opening ("aperture") 110. Frame 108 is made of a transparent or semi-transparent material (for example single crystal silicon) and is fixedly attached (e.g. by bonding) to front mirror 104. That is, mirror 104 is "mounted" on frame 108 and therefore moves together with frame 108. Opening 110 allows light rays to enter the etalon through the front mirror. Therefore, the front mirror is also referred to sometimes as "aperture mirror".

In some examples, back mirror 102 and optionally front mirror 104 include a Titanium Oxide ($TiO_2$) layer deposited on a glass layer/substrate. In certain examples, a device disclosed herein may comprise one or more electrodes (not shown) formed on back mirror 102 on the surface facing frame 108, to enable actuation of the frame structure (and thereby cause movement of the front mirror) toward the back mirror. Alternative actuation mechanisms may be applied, e.g. piezoelectric actuation, Kelvin force, etc. The movement of the front mirror towards or away from the back mirror tunes the spectral transmission band profile of the etalon.

Device 100 further comprises an anchor structure (or simply "anchor") 112, made of a transparent or semi-transparent material (for example single crystal silicon). Anchor 112 and frame 108 are attached to each other by a flexure/suspension structure. The suspension structure may be for example a region of anchor structure 112 patterned in the form of a bending or torsional spring, a combination of such springs, or as a thin doughnut-shaped membrane adapted to carry the front mirror. In device 100, the suspension structure includes a plurality of suspension springs/flexures. According to some examples, in device 100, the plurality of suspension springs/flexures includes four springs, 114a, 114b, 114C and 114d, made of transparent or semi-transparent material (for example single crystal silicon. Together, frame 108, anchor 112 and springs 114 form a "functional mechanical layer" 300, shown in a top view in FIG. 3. In the following discussing the term "silicon" is used as a general non-limiting example. It is noted that the term silicon should not be construed as limiting and other materials are also contemplated including any material or combination of materials with suitable flexibility and durability required for the flexure structure to function in a desired way, for example plastic or glass.

FIGS. 2A-2C show that a surface of front mirror 104 facing incoming light is attached to frame 108. A different configuration of front mirror 104 and frame 108 is described below with reference to FIG. 10. It also shows that a flexure structure, comprising four springs 114a, 114b, 114C and 114d (see FIG. 3), is attached to anchor 112 and to frame structure 108 but not attached to the front mirror.

In some examples, frame 108 is spaced apart from back mirror 102 by a spacer structure (or simply "spacers") 116. According to some examples, spacers 116 can be formed of a glass material. Spacers 116 are used to separate the frame and springs from the plate in which mirror 102 is formed. While in principle silicon anchors 112 could be attached to the bottom plate directly without spacers 116, this requires very large deformation of the springs. For the adopted geometry, this deformation is beyond the strength limit of the spring material, which requires the presence of spacer layer 116. For technological reasons, in some examples, both movable front mirror 104 and spacers 116 are fabricated from the same glass plate (wafer). This simplifies fabrication, since the glass and silicon wafers are bonded at wafer level. For this reason, device 100 is referred to herein as a glass-silicon-glass (GSG) device.

Device 100 further comprises a cap plate (or simply "cap") 118 accommodating at least part of an actuation mechanism configured for controlling gap size between the front mirror and the back mirror. As shown cap 118 is located at object side relative to front mirror 104 at the direction of incoming light. In the example of electrostatic actuation, cap 118 accommodates electrodes 120 formed on or attached thereto (see FIGS. 2A to 2C). Electrodes 120 can be positioned for example at a bottom side (facing the mirrors) of cap 118. Electrodes 120 are in permanent electrical contact through one or more through-glass vias 124 with one or more bonding pads 126 positioned on the opposite (top) side of cap 118. Electrodes 120 are used for actuation of frame 108 (thereby causing movement of front mirror 104). The cap comprises a first recess (cavity) 119 to provide a "front" (also referred to as "electrostatic") gap d between frame 108 and electrodes 120. In the as-fabricated configuration (before the bonding of the device to the back mirror), FIG. 2A, gap d has a size $d_0$. After bonding, in the pre-stressed un-actuated state shown in FIG. 2B, gap d has a maximal size $d_{Mx}$. In any actuated state (as in FIG. 2C), gap d has a size $d_2$. Device 100 further comprises front stoppers 122 that separate between frame 108 and cap 118. In some examples, front stoppers 122 isolate electrically (prevent electrical shorts between) frame 108 from cap electrodes 120. In some examples, front stoppers 122 defines a maximal gap between front mirror 104 and back mirror 102. In one example, the cap is made of a glass material. In other examples, cap 118 may be made of a "hybrid" plate or hybrid material such that a central section ("aperture") through which the light rays pass is transparent to the wavelength of the light (made e.g. of a glass), while plate sections surrounding the aperture are made of a different material, for example silicon. The hybrid aspect may increase the stiffness and strength of the cap.

In certain examples, particularly where imaging applications are concerned, the length L and width W (FIG. 1A) of mirrors 102 and 104 should on one hand be large enough (e.g. on the order of several hundred micrometers (μm) to several millimeters (mm)) to allow light passage to a relatively wide multi-pixel image sensor. On the other hand, the minimal gap $g_{Mn}$ should be small enough (e.g. a few tens of nanometers (nm)) to allow desired spectral transmission properties of the etalon. This results in a large aspect ratio of the optical cavity between the mirrors (e.g. between the lateral dimensions W and L and the minimal gap distance $g_{Mn}$), which in turn requires that accurate angular alignment is maintained between the mirrors to reduce or prevent spatial distortion of the chromatic spatial transmission band of the etalon along the width/lateral spatial directions thereof. In some examples, $g_{Mn}$ may have a value of down to 20 nanometers (nm), while $g_{Mx}$ may have a value of up to 2 μm. According to one example, the value of $g_{Mx}$ may be between 300 to 400 nm. Specific values depend on the required optical wavelength and are dictated by a specific application. Thus, $g_{Mx}$ may be greater than $g_{Mn}$ by one to two orders of magnitude. In certain examples, L and W may each be about 2 millimeter (mm) and springs 114 may be each about 50 μm thick, about 30 μm wide and about 1.4 mm long. In certain examples, the thicknesses of the glass layers of the cap 118, the back mirror 102 and the front mirror 104 may be about 200 μm. In some examples, L=W.

It should be understood that all dimensions are given by way of example only and should not be considered as limiting in any way.

FIGS. 2A-2C provide additional information on the structure of device 100 as well as on the function of some of its elements. As mentioned, FIG. 2A shows device 100 in an initial as-fabricated and un-actuated, non-stressed state. As-fabricated, front mirror 104 does not touch back stoppers 106. FIG. 2B shows the device of FIG. 2A in an initial pre-stressed un-actuated state, with front mirror 104 physically touching back stoppers 106. The physical contact is induced by stress applied on the frame through the springs when spacer layer 116 is forced into contact with the glass wafer substrate (which includes back mirror 102) for eutectic bonding of spacers 116 to the glass plate of back mirror 102, see FIG. 9(c) below. Thus, the configuration shown in FIG. 2B (as well as in FIG. 5B) is said to be "pre-stressed". FIG. 2C shows the device in an actuated state, with front mirror 104 in an intermediate position between back stoppers 106 and front stoppers 122, moved away from back mirror 102.

In some examples, back mirror 102 includes a second recess 128 with a depth t designed to provide pre-stress of the springs after assembly/bonding. According to some examples, recess depth t is chosen on one hand such that the contact force arising due to the deformation of the springs and the attachment of front movable mirror 104 to back stoppers 106 is high enough to preserve the contact in the case of shocks and vibrations during the normal handling of the device. On the other hand, in some examples, the combined value of recess depth t plus the maximal required travel distance (maximal back gap size) $g_{Mx}$ is smaller than one third of an as-fabricated ("electrostatic") gap size $d_0$ of a gap between electrodes 120 and frame 108 (FIG. 2A), to provide stable controllable electrostatic operation of the frame by the electrodes located on the cap. In certain examples, the as-fabricated electrostatic gap $d_0$ may have a value of about 3-4 μm and t may have a value of about 0.5-1 μm. The requirement for stable operation is $t+g_{Mx}<d_0/3$, since the stable travel distance of a capacitive actuator is ⅓ of the as-fabricated electrostatic gap, i.e. is $d_0/3$.

Note that in certain examples, an un-actuated state may include a configuration in which movable mirror 104 is suspended and does not touch either back stoppers 106 or front stoppers 122.

In the actuated state, shown in FIG. 2C, the mounting ring and the front mirror are displaced away from the back mirror. This is achieved by applying a voltage V between the one or more regions/electrodes 120 of the actuation substrate serving as an actuating electrode and the one or more regions frame 108.

According to some examples, device 100 is fully transparent. It includes a transparent back mirror (102), a transparent front mirror (104) and a transparent cap (118) as well as transparent functional mechanical layer 300. One advantage of the full transparency is that the device can be observed optically from two sides. Another advantage is that this architecture may be useful for many other optical devices incorporating movable mechanical/optical elements, such as mirrors, diffractive gratings or lenses. In some examples, device 100 is configured as a full glass structure, where the functional mechanical layer includes a glass substrate that is pattered to accommodate/define the suspension structure carrying the top mirror, the suspension structure including a plurality of glass springs/flexures.

Figure 3:
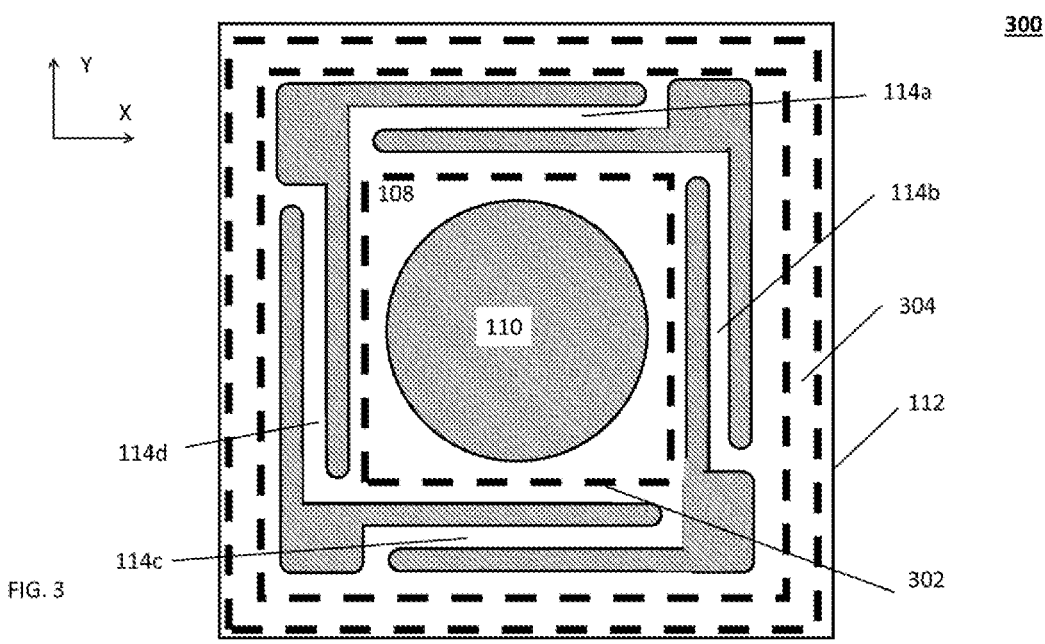
FIG. 3 shows schematically a top view of the functional mechanical layer in the device of FIG. 1A or FIG. 1B, according to an example of the presently disclosed subject matter.

'FIG. 3 shows schematically a top view of functional mechanical layer 300. The figure also shows an external contour 302 of front mirror 104, aperture 110, anchor structure 112, springs 114a-d (flexure structure) and a contour 304 enclosing a eutectic bond frame 121 and cap spacers 122 as further described in more detail with reference to FIG. 4 below.

Figure 4:
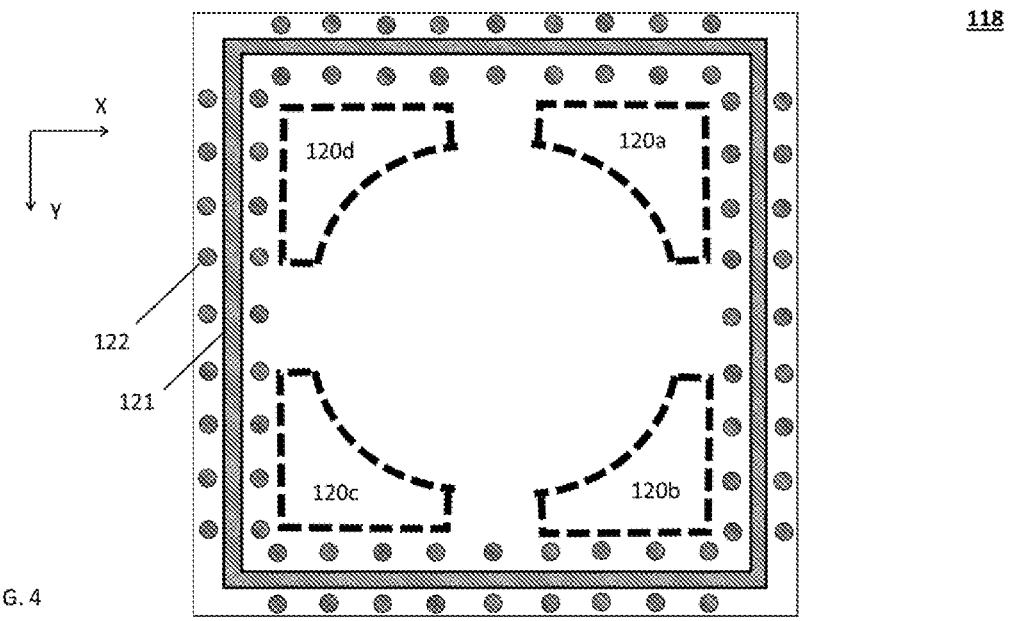
FIG. 4 shows schematically a top view of the cap in the device of FIG. 1A or FIG. 1B with multiple electrodes formed thereon, according to an example of the presently disclosed subject matter.

FIG. 4 shows schematically a top view of cap 118 with a plurality of electrodes 120, marked here 120a, 120b, 120c and 120d. The number and shape of electrodes 120 shown are shown by way of example only and should not be construed as limiting. According to some examples, three electrodes 120 are required to control both the displacement of the frame in the Z direction and the tilting of the frame about X and Y axes. Multiple electrode regions, e.g. as shown in FIG. 4, may be fabricated on cap 118 such that front mirror 104 can be actuated with an up-down degree of freedom (DOF) along the Z direction and can also be tilted (e.g. with respect to two axes X and Y) to provide additional angular DOF(s). This allows adjustment of angular alignment between front mirror 104 and back mirror 102. According to some examples, cap 118 may include a deposited eutectic bonding material 121. Furthermore, spacers 122 may be used to precisely control the electrostatic gap between the cap electrodes 120 and the actuator frame 108 serving as the second electrode. According to the presently disclosed subject matter, the eutectic bonding material 121 can be made to assume the shape of a frame. In such case, spacers 122 can be placed on both sides of the frame (inner and outer) and thereby minimize bending moments acting on the cap as a result of the eutectic bonding shrinkage during the bonding process.

Following is an example of a method of use of device 100. Device 100 is actuated to bring the etalon from the initial pre-stressed un-actuated state (FIG. 2B) to an actuated state (e.g. as in FIG. 2C). The actuation moves frame 108 and front mirror 104 away from back mirror 102, increasing the back gap between the mirrors. An advantageously stable control of the back gap is enabled by the innovative design with an initial as-fabricated (and non-stressed) state. More specifically, this design includes an initial maximal as-fabricated (and non-stressed) front gap size $d_0$ (FIG. 2A), which is about three times larger than the combined recess depth t and the maximal required travel (back gap) size $g_{Mx}$. This is because the stable range of the parallel capacitor electrostatic actuator is one third of the initial distance between the electrodes.

According to one example, device 100 may be used as a pre-configured filter for specific applications. For example, the device may be pre-configured to assume two different states, where the gap between the mirrors in each one of the two states (as set by the stoppers) is according to the desired wavelength. For example, one state provides a filter that allows a first wavelength range to pass through the etalon, while the other state allows a second wavelength range to pass through the etalon. The design for such a "binary mode" filter is related to a simple and accurate displacement of the mirrors between the two states, and allows simplified manufacturing.

According to one example, one state is the initial un-actuated etalon state $g_1$ (where the gap size between the mirrors is defined by stoppers 106) selected to allow a first wavelength range to pass through the etalon and the other state is one actuated state in which the gap has an actuated gap size $g_2$, greater than the pre-stressed un-actuated gap size and resulting in electrical gap $d_2$ which is equal to the height of front stoppers 122, selected to allow a second wavelength range to pass through the etalon. In the second state frame 108 is in contact with front stoppers 112.

Figure 5A:
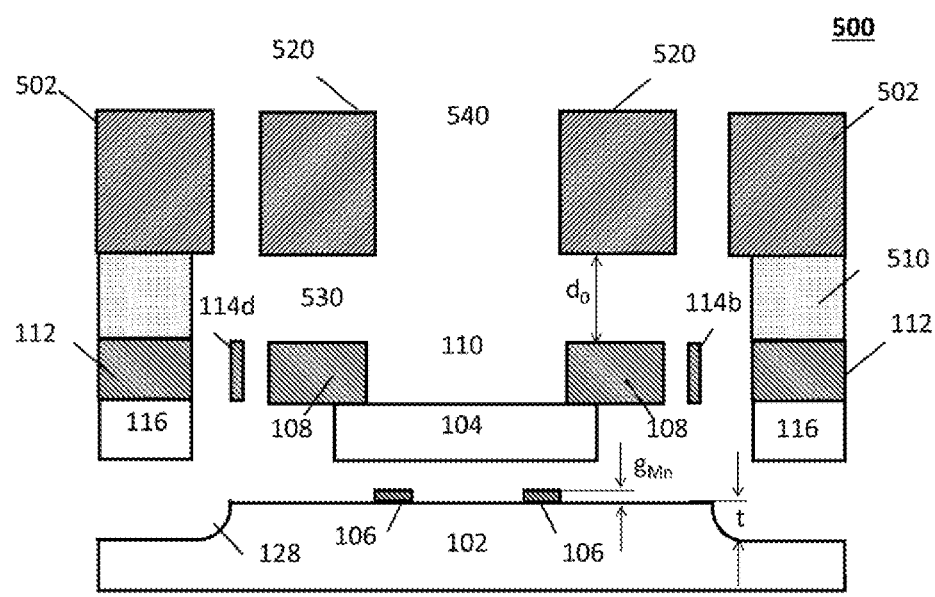
FIG. 5A shows schematically a tunable MEMS etalon device, in a cross-sectional view and in an initial as-fabricated, non-stressed un-actuated state, according to another example of the presently disclosed subject matter.
Figure 5B:
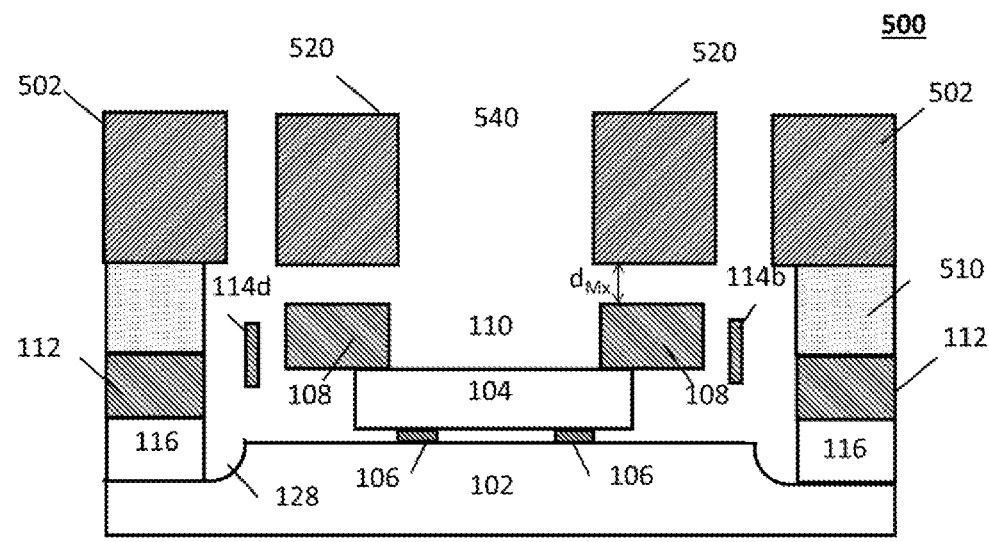
FIG. 5B shows the device of FIG. 5A in an initial pre-stressed un-actuated state, according to an example of the presently disclosed subject matter.
Figure 5C:
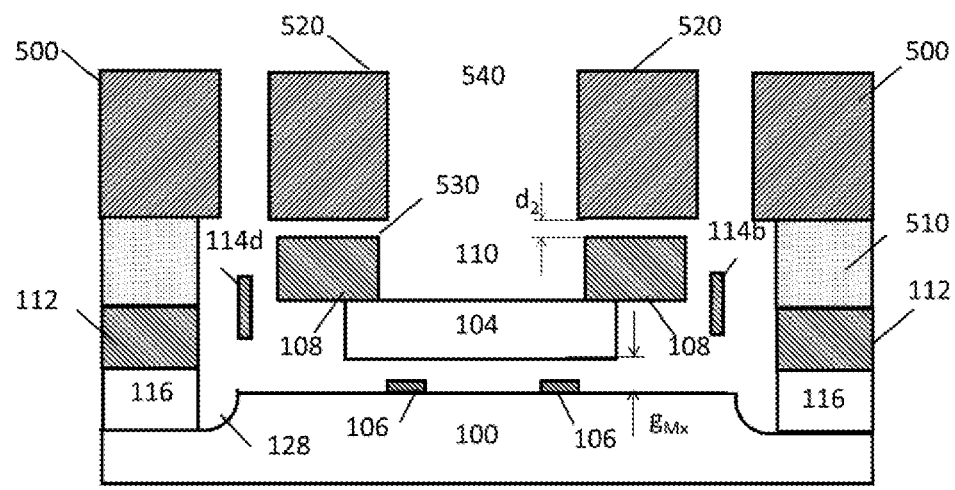
FIG. 5C shows the device of FIG. 5B in an actuated state, according to an example of the presently disclosed subject matter.

FIGS. 5A-5C show schematically in cross-sectional views a second example of a tunable MEMS etalon device disclosed herein and numbered 500. FIG. 5A shows device 500 in an as-fabricated (non-stressed) configuration, before the bonding of spacers 116 to the back mirror 102. FIG. 5B shows device 500 in an initial pre-stressed un-actuated state, while FIG. 5C shows device 500 in an actuated state. Device 500 uses a SOI wafer and SOI fabrication technology and is therefore referred to herein a "SOI device", in contrast with GSG device 100. Device 500 has a similar structure to that of device 100 and includes many of its elements (which are therefore numbered the same). Since both SOI wafers and technology are known, the following uses SOI terminology known in the art.

In FIG. 5A, front mirror 104 is not in physical contact with the back stoppers 106 on back mirror 102, while in FIG. 5B, the pre-stress brings front mirror 104 and back stoppers 106 into physical contact. In FIG. 5C, front mirror 104 has moved away from back mirror 102 and is in an intermediate position between the back stoppers 106 and electrodes 520, which in the SOI device are made of a handle layer 502 of the SOI wafer. The SOI wafer is used such that the handle layer serves as a substrate as well as for fabrication of electrodes 520. Frame 108 includes regions that serve as the opposite electrode. An anchor structure (layer) 112 in the device Si layer of the SOI wafer is connected to frame 108 through springs 114*a-d*. Anchor structure 112 is attached to handle layer 502 through a BOX layer 510. A gap between the Si device and handle layers is indicated by 530. Gap 530 is created by etching the BOX layer 510 under the frame and under the springs. An opening 540 is formed in handle layer 502, exposing front mirror 104 and back mirror 102 to light rays in the −Z direction.

In the as-fabricated state, before the bonding of spacers 116 to the glass plate comprising back mirror 102, gap 530 between the frame and the handle layer has a size $d_0$ and is equal to the thickness of the BOX layer, FIG. 5A. After the bonding, gap 530 has a size $d_{Mx}$ equal to the thickness of BOX layer 510 minus the depth t of recess 128 and minus the height of back stoppers 106. Thus, $d_{Mx}$ is smaller than $d_0$ due to the pre-stress, since when front mirror 104 contacts back stoppers 106 the springs are deformed and the size of released gap 530 decreases. Upon actuation, FIG. 5C, frame 108 pulls front mirror 104 away from back mirror 102, further decreasing the size of gap 530 to $d_2$ and increasing the size of the back gap (at most, up to a maximal size $g_{Mx}$).

Figure 6:
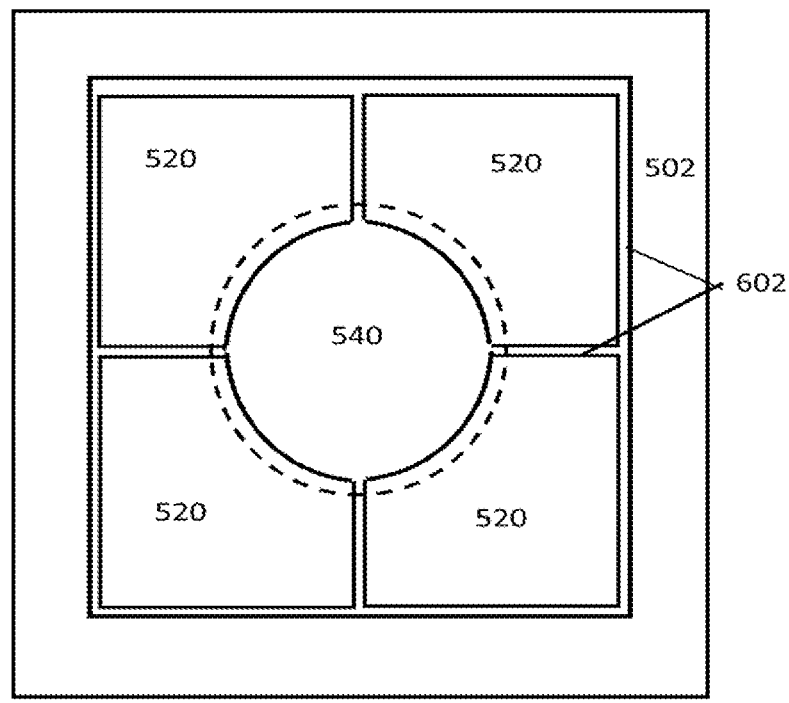
FIG. 6 shows a bottom view of the handle layer of the SOI wafer in the device of FIG. 5A or 5B, according to an example of the presently disclosed subject matter.

FIG. 6 shows a schematic illustration of a bottom view of the handle layer of the SOI wafer. The figure shows an insulating trench 602 between electrodes 520. In certain examples, one or more regions/electrodes of the handle layer 520 may include two or more regions that are substantially electrically insulated from one another. Accordingly, application of different electric potentials between these two or more regions of handle layer 520 and of frame 108 allows adjusting parallelism between the front mirror and the back mirror. For instance, the two or more regions of the handle layer may include at least three regions, arranged such that parallelism between the front and back mirrors can be adjusted two-dimensionally with respect to two axes.

Figure 7:
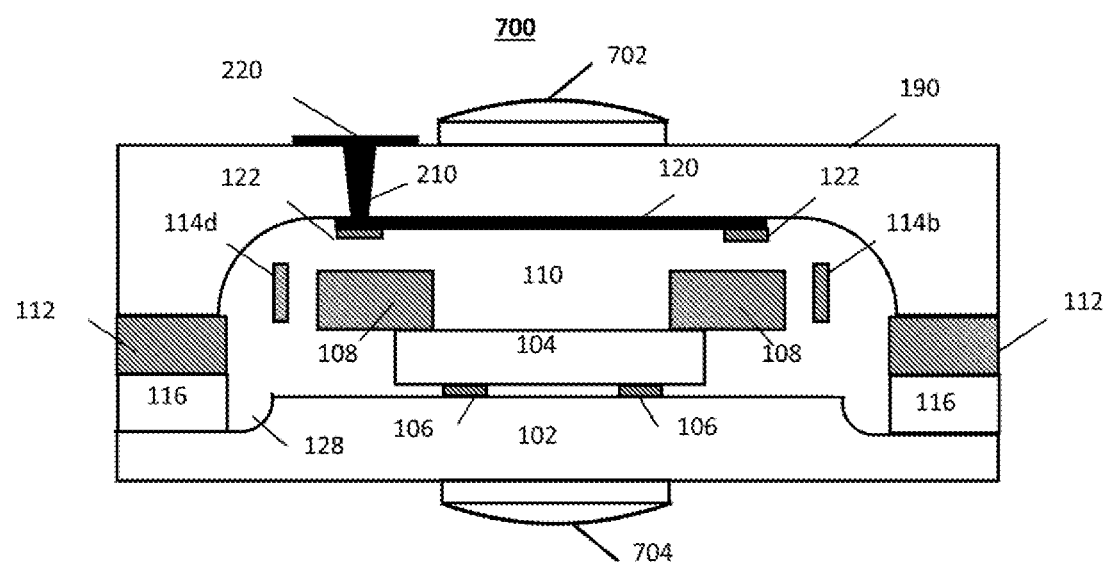
FIG. 7 shows an assembly comprising a device disclosed herein with integrated optics, according to an example of the presently disclosed subject matter.

FIG. 7 shows a schematic illustration of an assembly comprising a device 700 with a lens 702 formed in, on, or attached to the cap, and a lens 704 formed in, on, or attached to the back mirror. This allows integration of optics with the etalon to provide an "integrated optics" tunable etalon device. Also, in case there is an under-pressure inside the cavity between the two glasses, the addition of such lenses improves the stiffness and decreases deformation of the back mirror and of the cap. Other elements are as marked in device 100.

Tunable etalons disclosed herein in devices 100 and 500 may be used for imaging applications. For example, these devices may be designed and used as a wide dynamic filter tunable over a wide spectral band (e.g. extending from infra-red [IR] or near-IR (NIR) wavelengths in the long wavelength side of the spectrum, through the visible (VIS) range down to the violet and/or ultra-violet (UV) wavelengths at the short wavelength side of the spectrum. Additionally or alternatively, such devices may be designed to have a wide spectral transmission profile (e.g. a full width half maximum (FWHM) of the spectral transmission profile of approximately 60-120 nm, which is suitable for image grabbing/imaging applications) and to also have a relatively large free spectral range (FSR) between successive peaks on the order of, or larger than 30 nm, thereby providing good color separation.

Devices disclosed herein use for example electrostatic actuation to tune the spectral transmission and other properties of the etalon. The term "electrostatic" actuation is used to refer to close gap actuation provided by a parallel plate electrostatic force between one or more electrodes on each of two layers of a device. For example, in device 100, the electrostatic actuation is performed by applying voltage between one or more regions of frame 108 and one or more electrodes 120 formed/deposited on the bottom surface of cap 118. In device 500, the electrostatic actuation is performed by applying voltage between one or more regions of frame 108 and one or more regions of handle layer 502. This provides tunability of the displacement between the mirrors and therefore of the etalon.

One of the central challenges of the electrostatic actuation is the presence of so-called pull-in instability, which limits the stable displacement of the approaching electrode (e.g. mounting frame 108 in both device 100 and device 500) towards the static electrode (e.g. electrodes 120 or 520) to one-third of the initial gap between them. Thus, in electrostatic actuation configurations disclosed herein, the initial gap between the handle layer and the mounting frame or between the electrodes 120 and the mounting frame is significantly larger (at least 4-5 times) than the required maximal optical gap $g_{Mx}$. Therefore, the gap between the front and back mirrors in the range $g_{Mn}$ to $g_{Mx}$ is in a stable range of the actuator and the pull-in instability is eliminated.

As mentioned above electrostatic actuation is merely one example of an actuation mechanism used for tuning the gap between the front and back mirrors, which is applicable in MEMS etalon devices as disclosed herein and should not be construed as limiting. The presently disclosed subject matter further contemplates other types of actuation mechanisms such as piezo-electric actuation and Kelvin force actuation.

Specifically, in some examples the etalon system includes a piezoelectric actuation structure that is attached to the frame or flexure structures such that application of electric voltage enables actuation of the frame structure (and thereby causes movement of the front mirror) away from the back mirror. In some examples, upon actuation, frame 108 pulls front mirror 104 away from back mirror 102, thereby increasing the size of gap between them and thus increasing the size of the back gap. By placing several piezoelectric actuation structures on different parts/flexures/springs of the frame, the parallelism between the aperture mirror and the back mirror of the etalon can be controlled. Application WO 2017/009850 to the Applicant, which is incorporated herein by reference in its in entirety, describes examples of implantations of piezoelectric and Kelvin force actuation, see for example in FIGS. 8a to 8c and FIGS. 9a and 9b.

Figure 8:
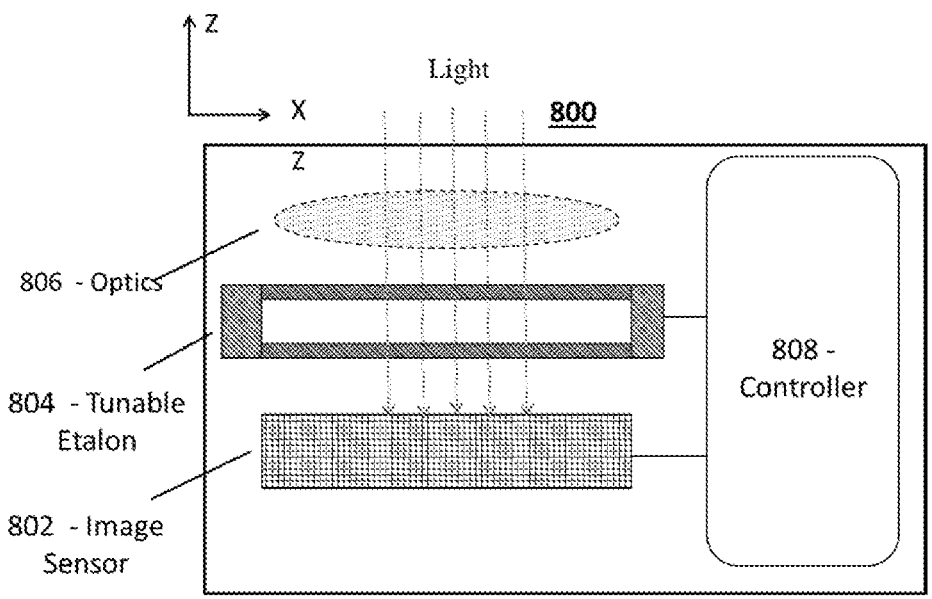
FIG. 8 illustrates schematically in a block diagram a sequential imaging system configured according to an example of the presently disclosed subject matter.

Reference is now made to FIG. 8 which illustrates schematically, in a block diagram, a sequential imaging system 800 configured according to an embodiment disclosed herein. System 800 includes an image sensor 802 (for example a multi-pixel sensor) and a tunable MEMS etalon device 804 configured according to the present invention as described above. Tunable MEMS etalon device 804 serves as tunable spectral filter and is placed in the general optical path of light propagation towards sensor 802 (e.g. intersecting the Z axis in the figure). Optionally, optics 806 (e.g. imaging lens(es)) are also arranged in the optical path of the sensor 802.

Color image acquisition can be carried out by the device 800 in similar way as described for example in patent application publication WO 2014/207742, which is assigned to the assignee of the present application and which is incorporated herein by reference. Tunable MEMS etalon device 804 when used in imaging system 800 is configured to provide a spectral filtering profile suitable for sequential color imaging with high color fidelity.

More specifically, according to various examples disclosed herein the materials of the back mirror 102 and front mirror 108 of the etalon and the tunable back gap size are configured such that the spectral filtration profile of the etalon is tunable in the spectral ranges in the visible and possibly also in the IR/near-IR ranges which are suitable for imaging of color images (for example with colors corresponding to the RGB space or to a hyper spectral color space). Also, the front and back mirrors and the tunable back gap size may be configured such that the transmission profile properties (including for example, FWHM and FSM) of the etalon are also suitable for sequential color imaging. For instance, the materials of the front and back mirrors and the tunable back gap size may be selected such that the FWHM of the spectral transmission profile of the etalon is sufficiently wide to match the FWHM of the colors in the conventional RGB space, and also that the FSR between successive transmission peaks in the spectral transmission profile is sufficiently large to avoid color mixing (to avoid simultaneous transmission to the sensor of different colors/spectral-regimes to which the sensor is sensitive). Further, the etalon may be relatively laterally wide (relative to the back gap size), such that it is wide enough to interpose in the optical path between optics 806 and all the pixels of the sensor 802, and on the other hand the gap between its mirrors is small enough to provide the desired spectral transmission properties and the tunability of the etalon.

System 800 may also include a control circuitry (controller) 808 operatively connected to the image sensor 802 and to the tunable MEMS etalon device 804 and configured and operable to tune the filter and to capture image data. For example, the capture of colored image data may include sequential acquisition of monochromatic frames corresponding to different colors (different spectral profiles) from the sensor. For example, controller 808 may be adapted for creating/capturing colored image data by sequentially operating tunable MEMS etalon device 804 for sequentially filtering light incident thereon with three or more different spectral filtering curves/profiles, and operating sensor 802 for acquiring three or more images (monochromatic images/frames) of the light filtered by the three or more spectral curves respectively. Tunable spectral filter (etalon device) 804 is operated to maintain each of the spectral filtering curves for corresponding time slot durations, during which sensor 802 is operated for capturing the respective monochrome images with respective integration times fitting in these time slots. Accordingly each of the captured monochrome images corresponds to light filtered by a different respective spectral filtering curve and captured by sensor 802 over a predetermined integration time. The control circuitry (e.g. controller) can be further configured to receive and process readout data indicative of the three or more monochrome images from the sensor and generate data indicative of a colored image (namely an image including information on the intensities of at least three colors in each pixel of the image).

The terms "controller" as used herein might be expansively construed to include any kind of electronic device with data processing circuitry, which includes a computer processor (including for example one or more of: central processing unit (CPU), a microprocessor, an electronic circuit, an integrated circuit (IC), firmware written for or ported to a specific processor such as digital signal processor (DSP), a microcontroller, a field programmable gate array (FPGA), an application specific integrated circuit (ASIC), etc.) adapted for executing instruction, stored for example on a computer memory operatively connected to the controller, as disclosed herein below.

Figure 9:
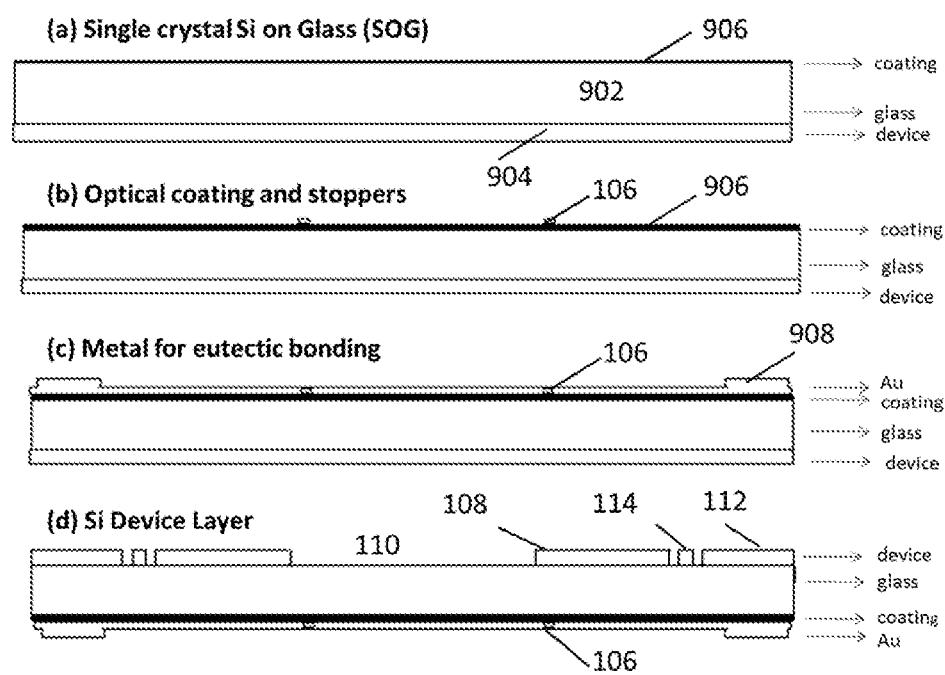
FIG. 9 shows schematically stages in a fabrication process of a GSG tunable MEMS etalon device disclosed herein, according to an example of the presently disclosed subject matter.
Figure 9:
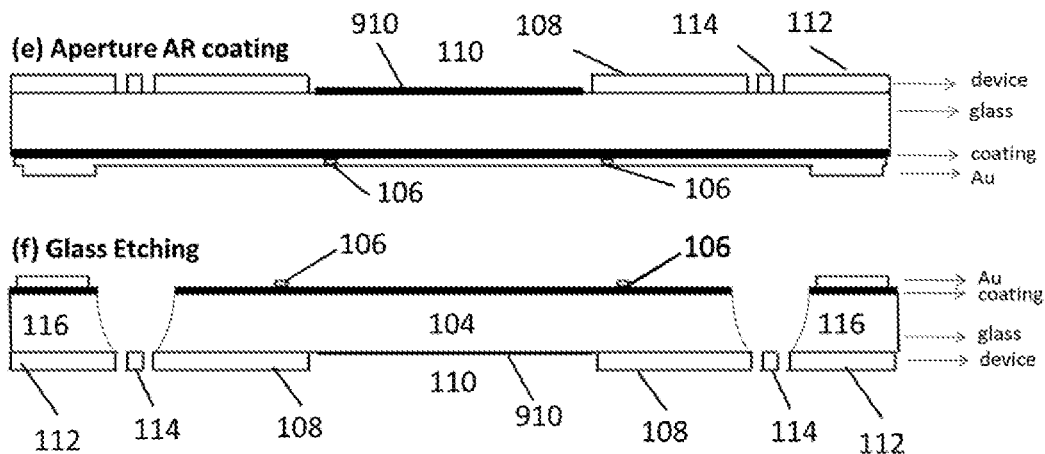
Figure 9:
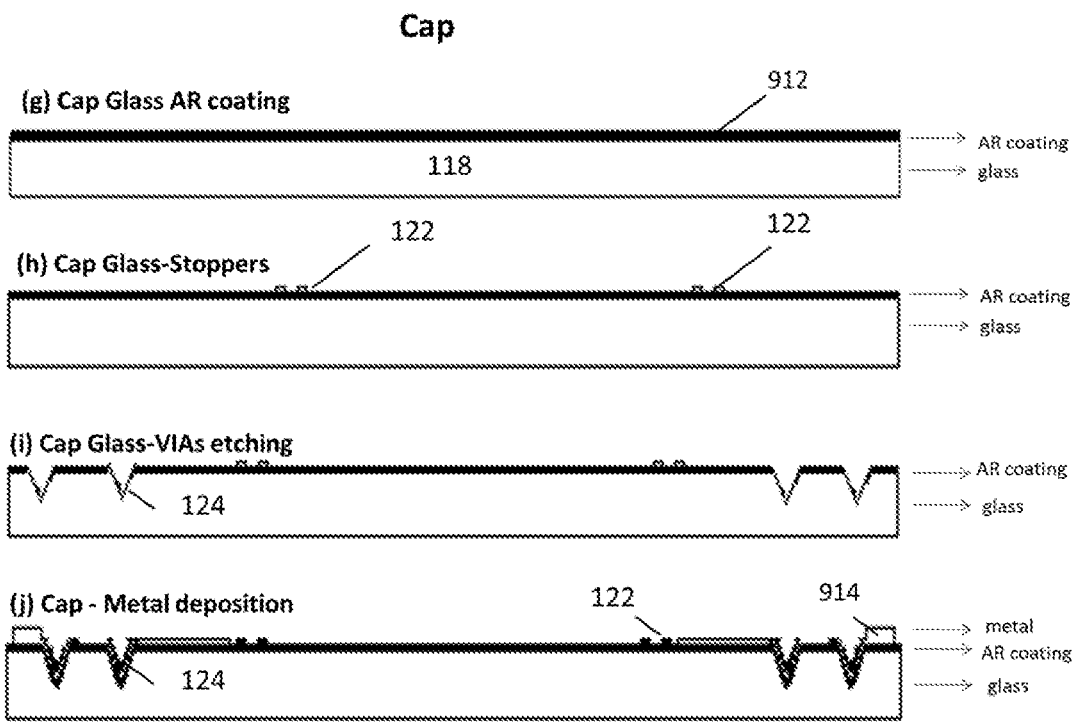
Figure 9:
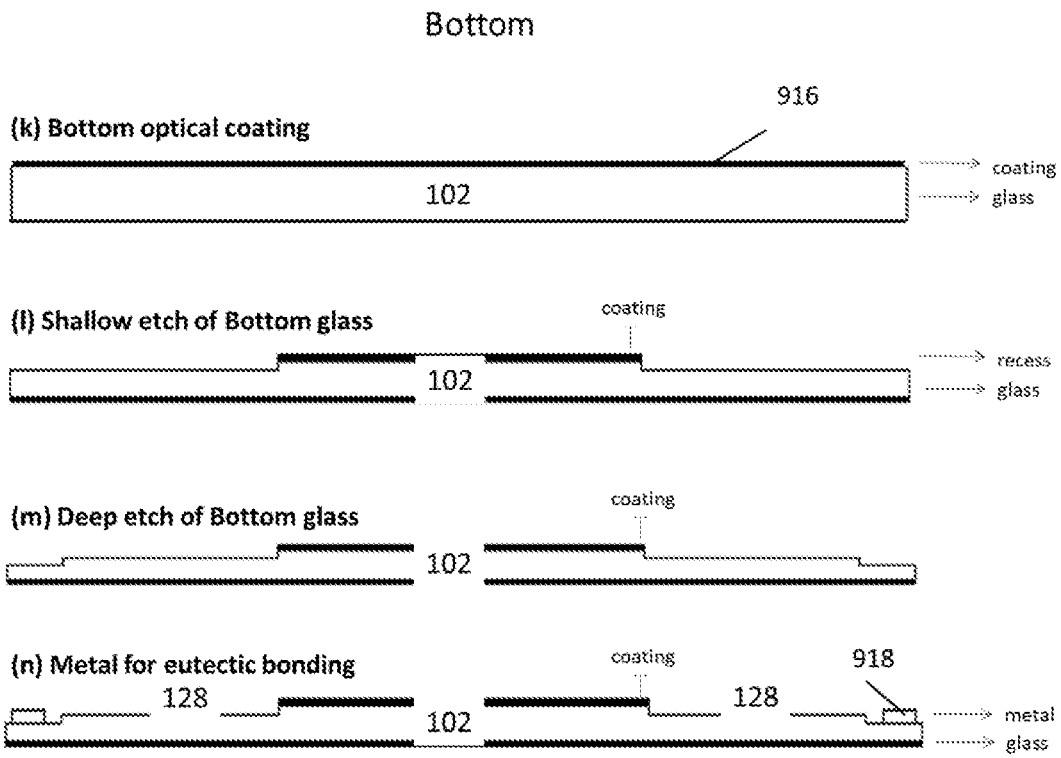
Figure 9:
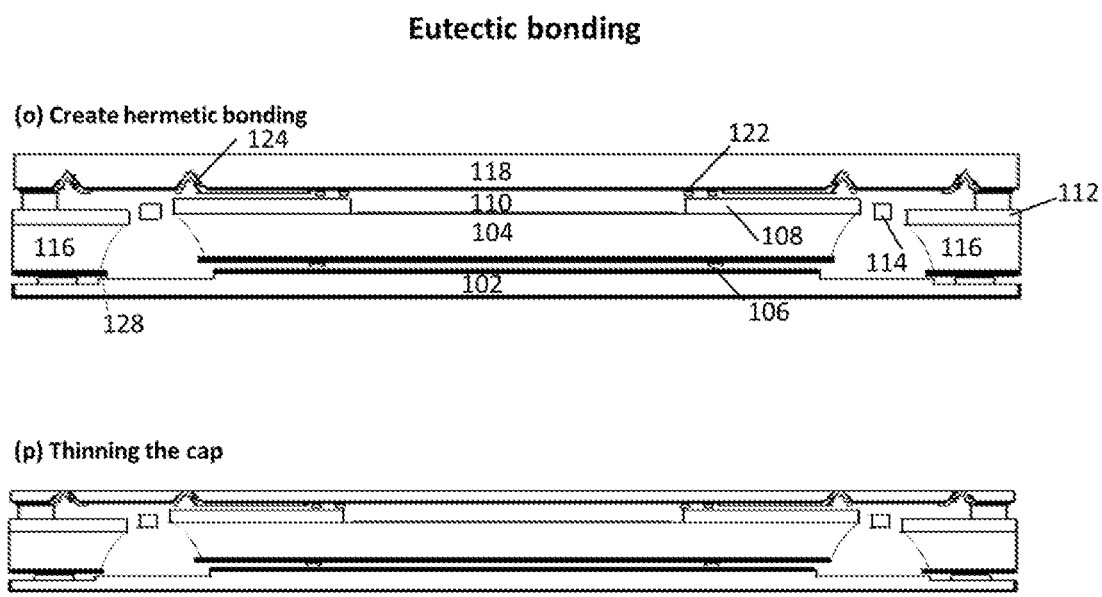
Figure 9:
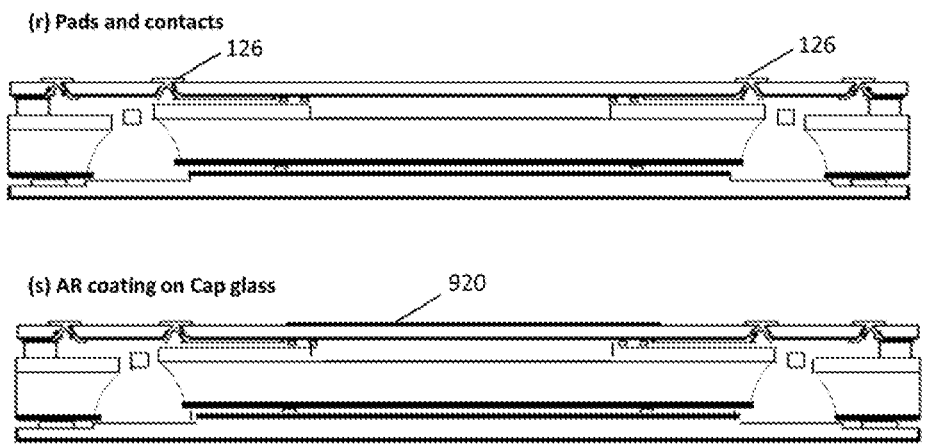

FIGS. 9(a) to 9(s) show schematically stages in a fabrication process of a GSG tunable MEMS etalon device such as device 100, according to one example of the presently disclosed subject matter. The process starts with a silicon-on-glass (SOG) wafer, FIG. 9(a) that includes a glass plate (also referred to as "glass wafer" or "glass layer") 902 and a silicon device layer 904. The glass plate, which will be used to form an upper movable mirror 104 and spacers 116, is first coated by an optical coating 906 (e.g. Titanium oxide), FIG. 9(b). Then, a metal layer is deposited and lithographically patterned to serve as a soldering material for eutectic bonding of spacers 116 to bottom mirror 102, FIG. 9(c). The SOG wafer is then flipped over and the Si device layer 904 is etched using deep reactive ion etching (DRIE) with the glass wafer used as an etch stop. Frame structure 108 with the aperture 110, anchor structure 112 and springs 114 are then formed in Si device layer 904, FIG. 9(d). An antireflective coating (AR) 908 is deposited on the front (movable) mirror within the aperture area 110, FIG. 9(e). This is followed by the removal of the metal layer outside of the area of back stoppers 116 and etching of the glass, forming the front movable mirror 104 and stoppers 116, FIG. 9(f).

The processing of the cap wafer starts with the deposition of the AR coating on the surface of a cap glass wafer 118 facing the frame 108, FIG. 9(g). This step is followed by the patterning of front stoppers 126 on the same surface of the cap wafer, FIG. 9(h). The AR coating and the glass of the cap wafer are partially etched as a part of through-glass vias 124 formation, FIG. 9(i). Next, a metal (e.g. Cr—Au or Cu) is deposited in two stages to provide metallization of vias 124 and to form a solder structures for the eutectic bonding of the cap wafer to Si anchors 112, FIG. 9(j).

The bottom glass wafer serving as the bottom mirror is first covered by an optical coating, and bottom stoppers 106 are lithographically formed on the surface of coating 916, FIG. 9(k). As mentioned and alternatively (not shown), in another process embodiment bottom stoppers 106 may be lithographically formed on a surface of mirror 104. Then, recess 128 in the glass wafer is formed in two stages—a shallow etch, FIG. 9(l), and then a deep etch, FIG. 9(m). The shallow etch is aimed at the formation of a precise recess which defines the pre-stress of the springs, whereas the deep etch is needed to provide a room for the soldering metal for the eutectic bonding. The metal for the eutectic bonding is deposited and patterned within the deep-etched glass area, FIG. 9(n).

Using two eutectic bonding processes, spacers 116 formed on the glass layer of the SOG wafer are bonded to the bottom glass wafer and then the cap wafer is bonded to the Si layer of the SOG wafer, FIG. 9(o). The cap wafer is then chemo-mechanically thinned to expose the partially etched vias 124, FIG. 9(p). Metallic bonding pads 126 are lithographically formed at the top surface of the cap wafer, FIG. 9(r). Finally, an additional AR coating is deposited and patterned within the aperture area on top of the cap wafer. The cross-section of the finished, pre-stressed un-actuated device is shown schematically in FIG. 9(s).

Figure 10A:
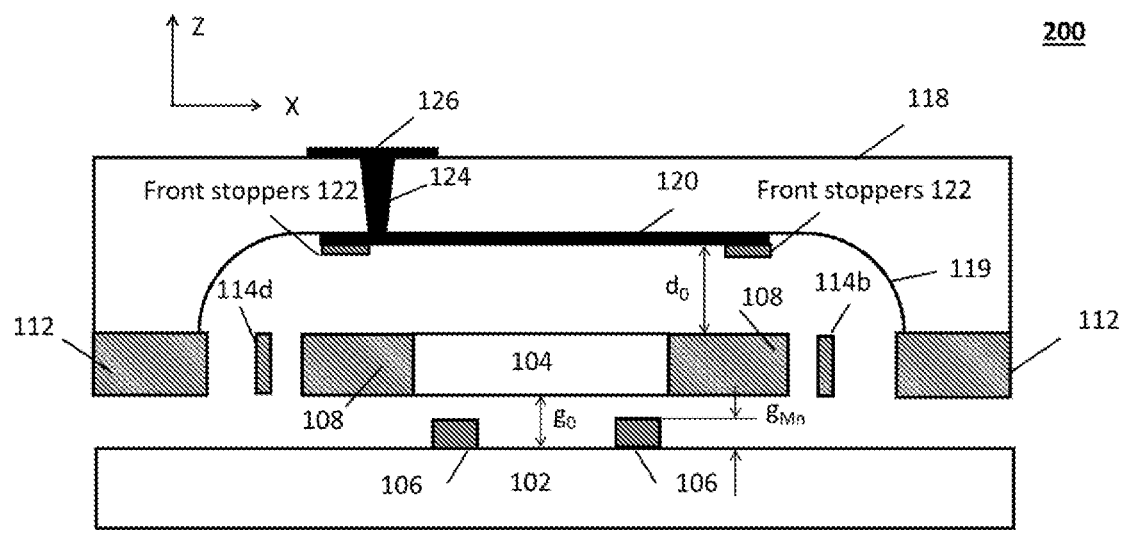
FIG. 10A shows schematically a tunable MEMS etalon device, in a cross-sectional view and in an initial as-fabricated, non-stressed un-actuated state, according to another example of the presently disclosed subject matter.
Figure 10B:
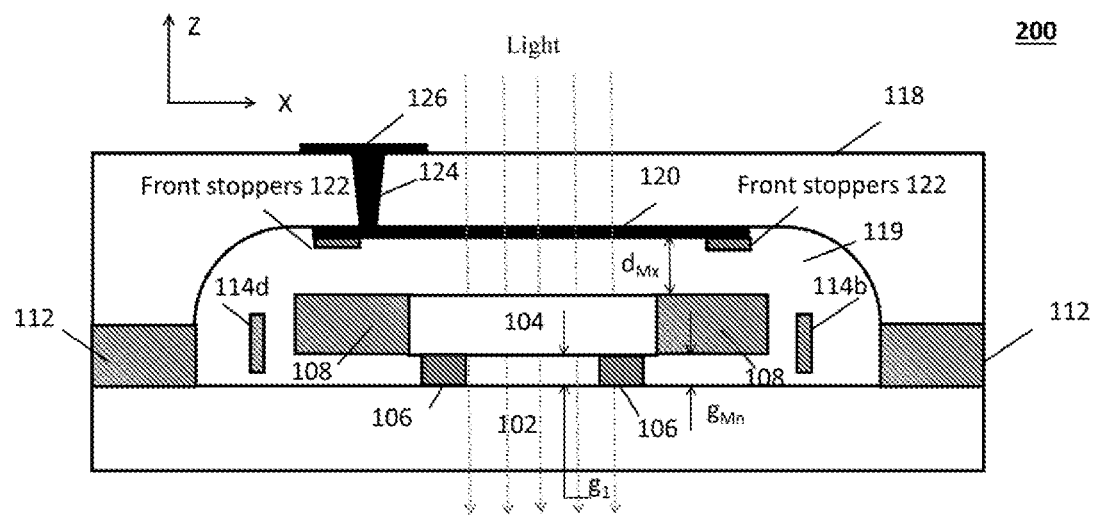
FIG. 10B shows the device of FIG. 10A in an initial pre-stressed un-actuated state, according to an example of the presently disclosed subject matter.
Figure 10C:
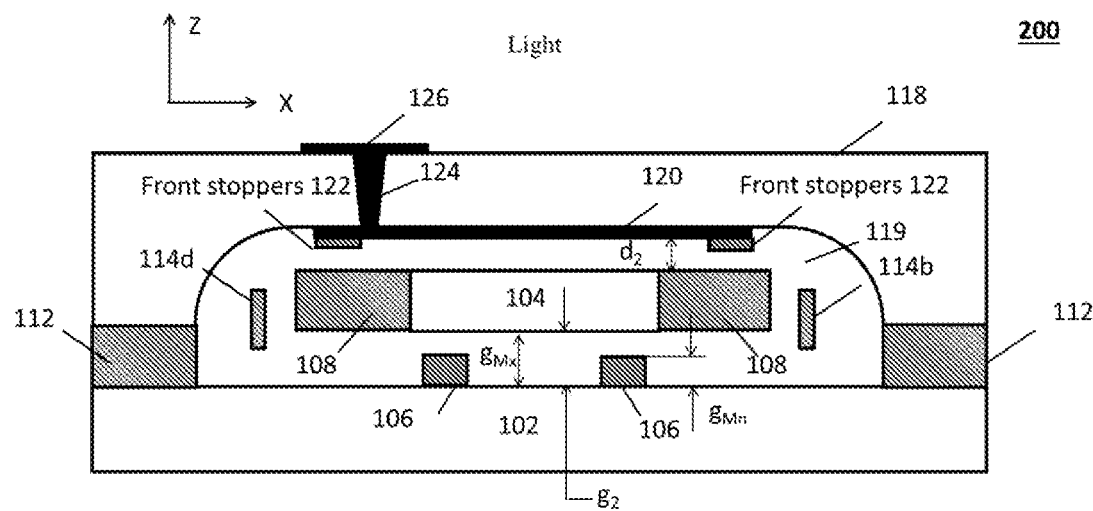
FIG. 10C shows the device of FIG. 10B in an actuated state, according to an example of the presently disclosed subject matter.

FIGS. 10A-10C show schematically in cross-sectional views a third example of a tunable MEMS etalon device disclosed herein and numbered 200.

FIG. 10A shows device 200 in an as-fabricated (non-stressed) configuration, before the bonding of anchor structure 112 to the back mirror 102. FIG. 10B shows device 200 in an initial pre-stressed un-actuated state, while FIG. 10C shows device 200 in an actuated state. Device 200 has a similar structure to that of device 100 and includes many of its elements (which are therefore numbered the same).

In some examples, front mirror 104 is formed in a hybrid layer in which the front mirror is made of a transparent or semi-transparent material (to light wavelengths in a desired range transmitted by the tunable etalon filter), and the anchor 112, flexure 114, and frame 108 structures are made of a relatively stiffer material. As shown in FIGS. 10A-10C front mirror is fabricated in alignment (e.g. from a single wafer) with frame 108 rather than being attached thereto from one side. In some examples, front mirror is made of anyone of the following materials: glass; plastic; or germanium, while the anchor 112, flexure 114, and frame 108 structures are made of silicon. It is noted that this list of material is not exhaustive and should not be construed as limiting.

In FIG. 10A, front mirror 104 is not in physical contact with the back stoppers 106 on back mirror 102, while in FIG. 10B, the pre-stress brings front mirror 104 and back stoppers 106 into physical contact. In FIG. 10C, front mirror 104 has moved away from back mirror 102, due to actuation, and is in an intermediate position between the back stoppers 106 and electrodes 120, In the as-fabricated state, front mirror 104 does not touch back stoppers 106. FIG. 10B shows the device of FIG. 10A in an initial pre-stressed un-actuated state, with front mirror 104 physically touching back stoppers 106. The physical contact is induced by stress applied on the frame through the springs when anchor structure 112 is forced into contact with the glass wafer substrate (which includes back mirror 102) for eutectic bonding to the glass plate of back mirror 102, see FIG. 9(c) below. Notably, height difference between back stoppers 106 and anchors assists in attaining the required stress. Thus, the configuration shown in FIG. 10B is said to be "pre-stressed".

FIG. 10C shows the device in an actuated state, with front mirror 104 in an intermediate position between back stoppers 106 and front stoppers 122, moved away from back mirror 102. In some examples, actuation is achieved by applying a voltage V between the one or more regions/electrodes 120 of the actuation substrate serving as an actuating electrode and the one or more regions frame 108.

As mentioned above, in some examples, the combined value of the maximal required travel distance (maximal back gap size) $g_{Mx}$ is smaller than one third of an as-fabricated ("electrostatic") gap size $d_0$ of a gap between electrodes 120 and frame 108 (FIG. 10A), to provide stable controllable electrostatic operation of the frame by the electrodes located on the cap. In certain examples, the as-fabricated electrostatic gap $d_0$ may have a value of about 2-4 μm. The requirement for stable operation is $g_{Mx} < d_0/3$, since the stable travel distance of a capacitive actuator is ⅓ of the as-fabricated electrostatic gap, i.e. is $d_0/3$.

Note that in certain examples, an un-actuated state may include a configuration in which movable mirror 104 is suspended and does not touch either back stoppers 106 or front stoppers 122.

According to some examples, device 200 is fully transparent. It includes a transparent back mirror (102), a transparent front mirror (104) and a transparent cap (118) as well as transparent anchor 112, flexure 114, and frame 108 structures. One advantage of the full transparency is that the device can be observed optically from two sides. Another advantage is that this architecture may be useful for many other optical devices incorporating movable mechanical/optical elements, such as mirrors, diffractive gratings or lenses.

All patents and patent applications mentioned in this application are hereby incorporated by reference in their entirety for all purposes set forth herein. It is emphasized that citation or identification of any reference in this application shall not be construed as an admission that such a reference is available or admitted as prior art.

While this disclosure has been described in terms of certain embodiments and generally associated methods, alterations and permutations of the embodiments and methods will be apparent to those skilled in the art. The disclosure is to be understood as not limited by the specific embodiments described herein, but only by the scope of the appended claims.

What is claimed is:

1. A tunable etalon device comprising:
   a front mirror and a back mirror, wherein the back mirror is linked to a plate,
   a flexure structure,
   an anchor structure and a frame structure attached to each other by the flexure structure,
   a back stopper structure,
   wherein the front mirror is movable with respect to the back mirror along a height direction (Z),
   wherein, in an initial pre-stressed un-actuated state of the tunable etalon device:
      the front mirror is in physical contact with the back stopper structure,
      wherein a height difference between:
         a position (Z1) along said height direction (Z) of a section of the anchor structure or of a section of an element linked to the anchor structure, wherein said section is in contact with said plate, and
         a position (Z2) along said height direction (Z) of a section of the front mirror in contact with the back stopper structure,
         induces pre-stress of the flexure structure, and
      wherein the front and back mirrors are separated by a gap having a pre-stressed un-actuated gap size, the tunable etalon device being configured to assume at least one actuated state in which the gap has an actuated gap size gap greater than the pre-stressed un-actuated gap size.

2. The tunable etalon device of claim 1, wherein
   the flexure structure is not attached to the front mirror, and
   wherein the element comprises a spacer structure separating the anchor structure from the back mirror.

3. The tunable etalon device of claim 2, wherein the front mirror and the spacer structure are formed in a same single layer,
   or the anchor structure, the frame structure and the flexure structure are formed in a same single layer.

4. The tunable etalon device of claim 1, wherein the position (Z1) is, along said height direction (Z), below said position (Z2).

5. The tunable etalon device of claim 1, wherein the plate to which the back mirror is linked comprises a layer made of a transparent or semi-transparent material.

6. The tunable etalon device of claim 5, wherein the transparent or semi-transparent layer further includes a recess for assisting in pre-stressing the flexure structure to enhance the pre-stressed un-actuated state.

7. The tunable etalon device of claim 1, wherein the plate to which the back mirror is linked comprises a combination of at least two materials wherein a first material of the at least two materials is transparent or semi-transparent, and a second material of the at least two materials is stiffer than the first material.

8. The tunable etalon device of claim 7, wherein the at least two materials include glass and silicon.

9. The tunable etalon device of claim 1, further comprising a cap plate located at object side relative to the front mirror and a front stopper structure that determines a minimal gap between the front mirror and a cap plate.

10. The tunable etalon device of claim 9, wherein the cap plate accommodates at least part of an actuation mechanism configured for controlling a gap size between the front mirror and the back mirror.

11. The tunable etalon device of claim 10, wherein the cap plate includes at least one first electrode formed on a cap surface facing the frame structure, wherein the frame structure is configured to act as a second electrode, and wherein the frame structure is movable by electrostatic actuation using the first and second electrodes.

12. The tunable etalon device of claim 11, wherein the front stopper structure determines a minimal electrostatic gap between the frame structure and the at least one first electrode.

13. The tunable etalon device of claim 11, further comprising a Si layer serving as the at least one first electrode, wherein the frame structure is configured to act as a second electrode, and wherein the frame structure is movable by electrostatic actuation using the first and second electrodes.

14. The tunable etalon device of claim 13, wherein the Si layer is a handle layer of a silicon-on-insulator (SOI) wafer; wherein optionally the at least one first electrode includes a plurality of first electrodes formed in the handle layer of the SOI wafer, the first electrodes connected mechanically and insulated electrically from each other; and
   wherein the tunable etalon device further comprising an opening in the handle layer of the SOI wafer to allow light passage to the front and back mirrors.

15. The tunable etalon device of claim 14, wherein the tunable etalon device further comprising a buried oxide (BOX) layer separating the Si layer from the frame structure, the BOX layer having a thickness that determines an electrostatic gap between the front mirror and the first electrode in the pre-stressed un-actuated device state.

16. The tunable etalon device of claim 10, wherein the actuation mechanism is selected from one of a piezoelectric actuator, Kelvin force actuation electrodes.

17. The tunable etalon device of claim 9, wherein the cap plate includes a transparent or semi-transparent material, thereby providing a tunable etalon enclosed between two transparent or semi-transparent plates.

18. The tunable etalon device of claim 9, wherein the actuated gap size between the front mirror and the back mirror is defined by front stoppers that separate between the frame structure and the cap plate.

19. The tunable etalon device of claim 1, designed to assume one of a first state and a second state, wherein the gap in each of the first and the second state allows light in a certain wavelength range to pass through the etalon;

wherein the first state is the initial pre-stressed un-actuated state having an un-actuated gap size between the front mirror and the back mirror, which is defined by the back stoppers; and the second state is an actuated state in which the gap size between the front mirror and the back mirror has an actuated gap size greater than the pre-stressed un-actuated gap size.

20. An imaging device comprising:
a) a tunable etalon device comprising a front mirror and a back mirror, wherein the back mirror is linked to a plate
a flexure structure,
an anchor structure and a frame structure attached to each other by the flexure structure,
a back stopper structure,
wherein the front mirror is movable with respect to the back mirror along a height direction (Z),
wherein, in an initial pre-stressed un-actuated state of the tunable etalon device:
the front mirror is in physical contact with the back stopper structure,
wherein a height difference between:
a position along said height direction (Z) of a section of the anchor structure or of a section of an element linked to the anchor structure, wherein said section is in contact with said plate, and
a position along said height direction (Z) of a section of the front mirror in contact with the back stopper structure, induces pre-stress of the flexure structure, and wherein the front and back mirrors are separated by a gap having a pre-stressed un-actuated gap size, the tunable etalon device being configured to assume at least one actuated state in which the gap has an actuated gap size gap greater than the pre-stressed un-actuated gap size;
b) an image sensor; and
c) a controller configured and operable to tune the tunable etalon device and to capture image data through the image sensor.

* * * * *